United States Patent [19]
Maloberti et al.

[11] Patent Number: 5,283,478
[45] Date of Patent: Feb. 1, 1994

[54] FAST CAPACITIVE-LOAD DRIVING CIRCUIT PARTICULARLY MEMORIES

[75] Inventors: Franco Maloberti, Pavia; Salvatore Portaluri, Lecce; Guido Torelli, Pavia, all of Italy

[73] Assignee: SGS-Thomson Microelectronics, S.R.L., Agrate Brianza, Italy

[21] Appl. No.: 811,323

[22] Filed: Dec. 20, 1991

[30] Foreign Application Priority Data

Dec. 28, 1990 [IT] Italy .................. 22569 A/90

[51] Int. Cl.$^5$ .................. H03K 3/01; H03K 5/12
[52] U.S. Cl. .................. 307/270; 307/263; 307/268; 307/572; 307/576; 328/59
[58] Field of Search .............. 307/270, 268, 263, 572, 307/575-576, 443; 328/59

[56] References Cited

U.S. PATENT DOCUMENTS

| | | | |
|---|---|---|---|
| 4,182,963 | 1/1980 | Yamado et al. | 307/268 |
| 4,216,393 | 8/1980 | Gilliberg et al. | 307/270 |
| 4,504,779 | 3/1985 | Haman | 323/349 |
| 4,698,531 | 10/1987 | Jones | 307/272.3 |
| 4,797,579 | 1/1989 | Lewis | 307/443 |
| 4,825,099 | 4/1989 | Barton | 307/270 |

FOREIGN PATENT DOCUMENTS

| | | |
|---|---|---|
| 164615 | 12/1985 | European Pat. Off. . |
| 0182913 | 7/1988 | Japan .................. 307/270 |
| WO-A-8808228 | 10/1988 | PCT Int'l Appl. . |

OTHER PUBLICATIONS

IBM Tech. Disc. Bul. "Driver circuit having controllable inactive time" Bigbie et al. vol. 18 No. 9 Feb. 1976 pp. 2751-2752.

IBM Technical Disclosure Bulletin, vol. 30, No. 8, Jan. 88, New York, U.S., pp. 455-456.

Primary Examiner—Margaret R. Wambach

[57] ABSTRACT

A fast capacitive-load driving circuit for driving output nodes on an integrated circuit. This circuit reduces noise interference caused by parasitic inductance by lowering the inductance voltage on the power supply lines during the switching process. This invention includes a voltage ramp, a voltage-to-current converter, and an output buffer having at least one pull-down transistor. A further embodiment includes an output buffer possessing a pull-down and a pull-up transistor.

24 Claims, 7 Drawing Sheets

FAST CAPACITIVE-LOAD DRIVING CIRCUIT PARTICULARLY MEMORIES

TECHNICAL FIELD OF THE INVENTION

The present invention relates to a circuit, suitable for CMOS technology, for the fast driving of a capacitive load. A typical application of the circuit according to the invention is in the driving of the output nodes of an integrated circuit for which a high switching speed is required, such as in a memory storage device.

BACKGROUND OF THE INVENTION

When the output buffer of an integrated circuit switches the voltage on the output node in order to change a given logic level, an inductive extra voltage is generated on the power supply lines. This extra voltage is determined by the product of the parasitic inductance L of the line (which is typically comprised between a few nH and over 10 nH) and the time derivative of the current $I_{out}$ supplied by the buffer in order to rapidly charge or discharge the load capacitor. This extra voltage (often termed "switching noise") can reach such values as to compromise the correct operation of the integrated circuit to which the buffer belongs. The problem is more serious in the case where several nodes in the same integrated circuit have the same driving requirements in terms of speed and capacitive load (for example the data outputs in a memory circuit), and there is the potential for simultaneous logic switching on a plurality of these nodes.

Figures 1, 2:
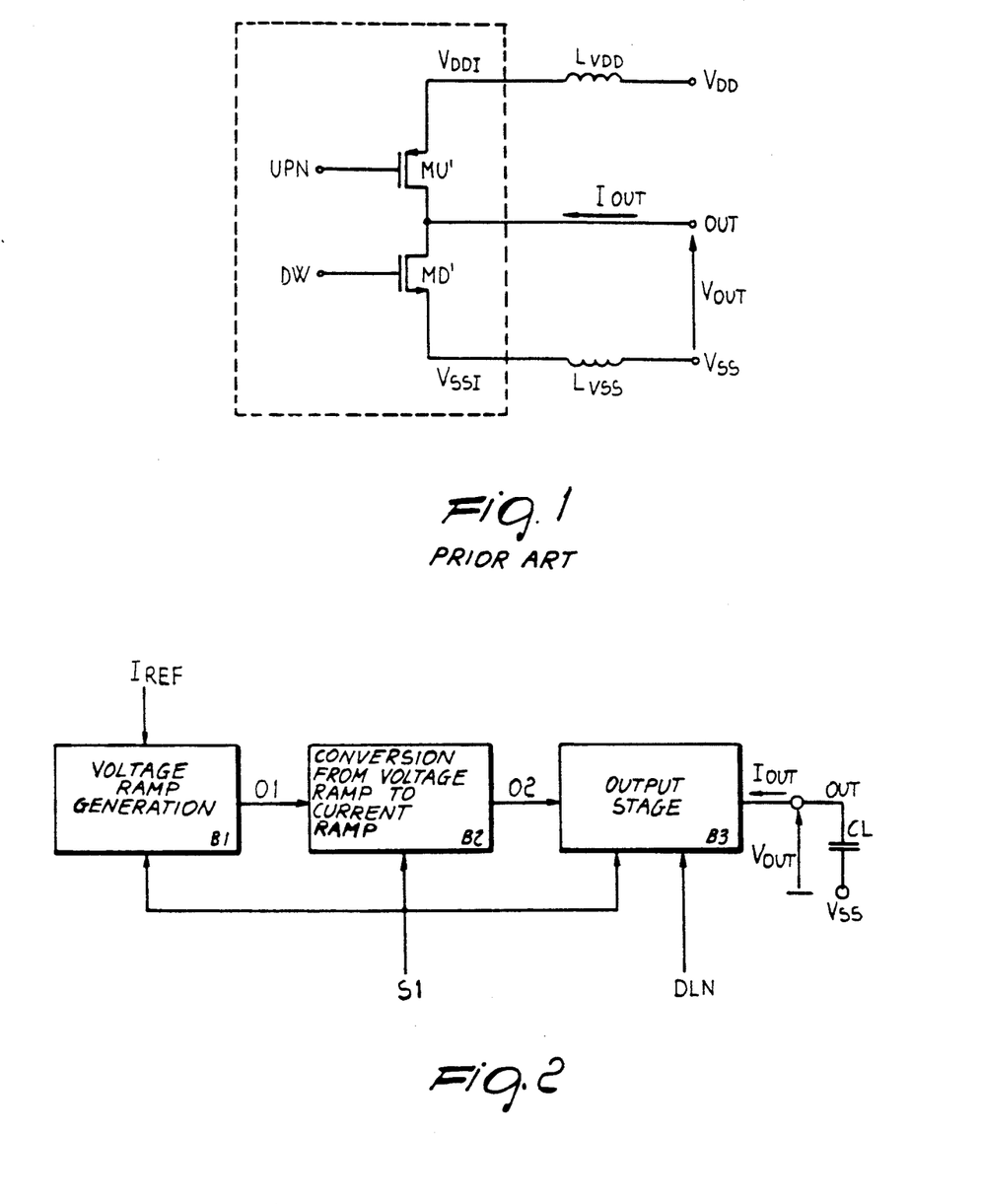
FIG. 1 is a simplified circuit diagram of an elementary output buffer of an integrated circuit according to the prior art.
FIG. 2 is a partial block diagram of a buffer executed according to the teachings of the invention.

FIG. 1 shows a known output circuit. The block indicated schematically by the broken line, contains a P-channel pull-up transistor MU' and an N-channel pull-down transistor MD' which have their sources connected to power supply lines $V_{DDI}$, and $V_{SSI}$, respectively. The output circuit includes a common node which is connected to the output node OUT to be switched.

The internal power supply lines are connected to respective external power supplies $V_{DD}$ and $V_{SS}$ through parasitic inductances $L_{VDD}$ and $L_{VSS}$. The transistors MU' and MD' are controlled by respective UPN and DW gate signals which can assume a low level (or "0"), typically equal to 0 V, or a high level (or "1"), typically 5 V. Each of the two signals shifts from one level to the other very rapidly, so as to have a low output voltage switching time (hereinafter more simply termed "switching time").

The two signals UPN and DW often coincide, but can be different in order to switch off both transistors. Switching off both transistors places the output node OUT in a high-impedance state ("tristate" operation). Additionally, this state minimizes the flow of direct current between $V_{DD}$, and $V_{SS}$, by means of appropriate timings of the signals.

In order to switch the output voltage $V_{OUT}$, for example from high to low, the two signals UPN and DW are both raised high. The transistor MU' switches off, and the transistor MD' starts to conduct, with a consequent sudden variation in the current which it delivers.

Current flows in the parasitic inductance $L_{VSS}$. This current flow creates switching noise. If the delivered current is reduced in order to reduce switching noise, the consequence is an undesirable increase in switching time.

A similar problem occurs when the opposite switching of the output voltage is performed.

Various proposals have been offered to solve the problem of switching noise without incurring excessive penalties in switching time. For example, the European patent application No. 284,357, filed on Mar. 22, 1988 in the name of S. Oshima et al., entitled "Semiconductor Integrated Circuit Having a Data Output Buffer Circuit", proposes to separate the pads and the metal lines for the power supply of the internal circuitry of the device and for the power supply of the buffer. These separated pads and metal lines would reduce the noise induced on the power supply lines of the internal circuitry of the integrated circuit during the switchings of the output voltage by reducing the greatest contribution to the parasitic inductance of a line; that is, by reducing the inductance given by the wire which connects the pad and the lead (termed "bonding wire"). This refinement may be useful but it is not a complete or substantially complete solution to the problem.

Another known method for reducing switching noise consists of introducing appropriate offsets among the switchings of different output nodes in order to prevent the adding of current variations related to different nodes. This solution is most effective in the case of simultaneous switching of a plurality of nodes.

Another method consists in replacing the pull-up and pull-down transistors of the buffer with a plurality of transistors in parallel, and by appropriately offsetting the switchings of the various transistors of an individual buffer (see D.T. Wong et al., "An 11-ns 8K×18 CMOS Static RAM with 0.5-µm Devices", *IEEE J. Solid-State Circuits*, vol. .C-23, No. 5, Oct. 1988, pages 1095-1103). These methods have the disadvantages of depending heavily on the manufacturing process and require in any case accurate experimental characterization.

Methods for preloading the output node at a level intermediate between $V_{SS}$ and $V_{DD}$ before performing actual switching are also well-known in the art (see for example T. Wada et al., "A 34-ns 1-Mbit CMOS SRAM Using Triple Polysilicon", *IEEE J. Solid-State Circuits*, vol. SC-22, No. 5, Oct. 1987, pages 727-732, or H. Okuyama et al., "A 7-ns 32K=8 CMOS SRAM", *IEEE J. Solid-State Circuits*, vol. SC-23, No. 5, Oct. 1988, pages 1054-1059). In this manner, the voltage change on the node when actual switching occurs is obviously reduced. Additionally, this method reduces the time variation of the associated current. This method is useful in those cases in which there is a dead time between the request for a new datum and its reading, for example in memory circuits.

Similarly, a method is described in the European patent application No. 271,331, filed on Dec. 9, 1987 in the name of S. Takayasu, entitled "Semiconductor Integrated Circuit". In this method, the output node is preloaded only when the initial output level is "1" and is also performed when an input value of an electronic circuit appears to be a high level (for example 2.5 V). The output node is not preloaded if the initial output level is "0" because this situation is considered non-critical.

All of the above described preloading methods reduce the extent of the problem but do not eliminate the problem. Furthermore, some of these methods may only be used with some types of device, such as memories.

Another method in widespread use for reducing switching noise consists of controlling the driving of the pull-up and pull-down transistors. The driving of the transistors is controlled such that the peak value of the time derivative $dI_{out}/dt$ of the current $I_{out}$ supplied by said transistors is as low as possible compatibly with the switching speed requirements. For example, it has been proposed to drive the gate electrodes of the output pull-up and pull-down transistors through a resistor which is arranged in series to said electrodes or to the positive and/or negative power supply of the logic gates which drive said electrodes. These resistors slow down, with a preset time constant, the rise and drop of the voltage applied to said electrodes; and, thus reduce the sudden variation in the current delivered by the buffer (see for example European patent application No. 251,910, filed on Jun. 25, 1987 in the name of M. Naganuma, entitled "CMOS Output Buffer Circuit"; or K.L. Wang et al., "A 21-ns 32K=8 CMOS Static RAM with a Selectively Pumped p-Well Array", *IEEE J. Solid-State Circuits*, vol. SC-22, No. 5, Oct. 1987, pages 704–711).

In other cases it has been proposed to perform this control of the driving voltages by means of active networks (see for example W.C.H. Gubbels et al., "A 40-ns/100pF Low-Power Full-CMOS 256K (32K×8) SRAM", *IEEE J. Solid-State Circuits*, vol. SC-22, No. 5, Oct. 1987, pages 741–747; or S.T. Chu et al., "A 25-ns Low-Power Full-CMOS 1-Mbit (128K×8) SRAM", *IEEE J. Solid-State Circuits*, vol. SC-23, No. 5, Oct. 1988, pages 1078–1084).

However, the above mentioned methods for controlling the driving of the transistors of the buffer have led to solutions which predominantly depend on the manufacturing process. Dependence on the manufacturing process necessarily leads to the need to comply with rather wide design margins. For instance, a design margin might include the setting for the maximum peak value of the time derivative of the output current. Compliance with these wide design margins result in the reduction of the switching speed of the output buffer. Thus, there is a need for a fast driving current generator which minimizes switching noise at high switching speeds even with heavy capacitive loads.

SUMMARY OF THE INVENTION

The aim of the invention is to provide a current generation circuit for the fast driving of even heavy capacitive loads, which minimizes the switching noise due to the parasitic inductance coils on the power supply lines while still ensuring a high switching speed. Another object of the invention is to provide such a circuit so as to allow the circuit designer to set the best compromise between switching speed and switching noises.

The invention achieves this aim, and other objects and advantages as will become apparent hereinafter, with a fast capacitive-load driving circuit for integrated circuits, particularly memories. The invention comprises at least one pull-down output transistor which is suitable for driving capacitive load. Additionally, the invention comprises a ramp voltage generation circuit, a voltage/current conversion circuit, and a current-mirroring circuit. The ramp voltage generation circuit can be controlled by a timing signal in order to generate a voltage which varies in time in a linear manner during a desired interval. The voltage/current conversion circuit is driven by the output of said ramp voltage generation circuit and is suitable for generating a current which is proportional to said voltage. Further, the current-mirroring circuit is driven by the output of the voltage/current conversion circuit and mirrors the current generated by the conversion circuit in the pull-down output transistor by a preset mirroring ratio.

Another embodiment of a fast capacitive-load driving circuit for integrated circuits, particularly memories, includes at least one pull-down output transistor and a pull-up output transistor which are suitable for driving said capacitive load. This embodiment includes a ramp voltage generation circuit and a voltage/current conversion. The voltage-generation circuit can be controlled by a timing signal in order to generate a voltage which varies in time in a linear manner during a desired interval. The voltage/current conversion circuit is driven by the output of said ramp voltage-generation circuit and is suitable for generating a current which is proportional to the voltage. The current-mirroring circuit is driven by the output of said voltage/current conversion circuit and mirrors the current from the voltage/current conversion circuit in the pull-down output transistor with a preset mirroring ratio when a first control signal is present. The current-mirroring circuit is also driven by the output of said voltage/current conversion circuit and mirrors the current from the voltage/current conversion circuit in the pull-up output transistor with a selected mirroring ratio when a second control signal is present.

BRIEF DESCRIPTION OF THE DRAWINGS

The invention is now described in greater detail with reference to some preferred embodiments thereof, illustrated in the accompanying drawings, given only by way of non-limitative example.

DETAILED DESCRIPTION

For the sake of simplicity in the description, only a part of an output buffer according to the invention, suitable for performing only switching from "1" to "0", is illustrated in FIG. 2. The execution of a complete buffer also requires a circuit which performs the function of switching from "0" to "1". This type of circuit can be configured in a complementary manner to the one of FIG. 2, or can be provided in a more advantageous manner, as will be described hereinafter with reference to FIG. 7.

In FIG. 2, a block B1 generates a voltage ramp which is applied to a block B2 for converting the voltage ramp into a current ramp. The current from the current ramp is applied to an output stage B3 which directly drives an output node OUT to which a capacitive load $C_L$ is connected. The three blocks B1, B2 and B3 are controlled by a single timing signal S1 which is raised to a high level only in a specified time interval assigned to output switching. The signal S1 is low outside said specified interval. The block B1 receives as input a current $I_{REF}$ which has a constant value. The output stage B3 is controlled by a signal DLN which is kept at "0" if the logic level to be provided in output OUT is low and at "1" if the logic level to be provided in output OUT is high.

When the signal S1 becomes high, the voltage ramp in the output from the block B1 begins. Consequently, the current ramp in the output from the block B2 also begins. In the block B3, the current ramp is mirrored in the pull-down transistor with a mirroring factor sufficient to allow the discharge of the load capacitor within the desired time.

Figure 3:
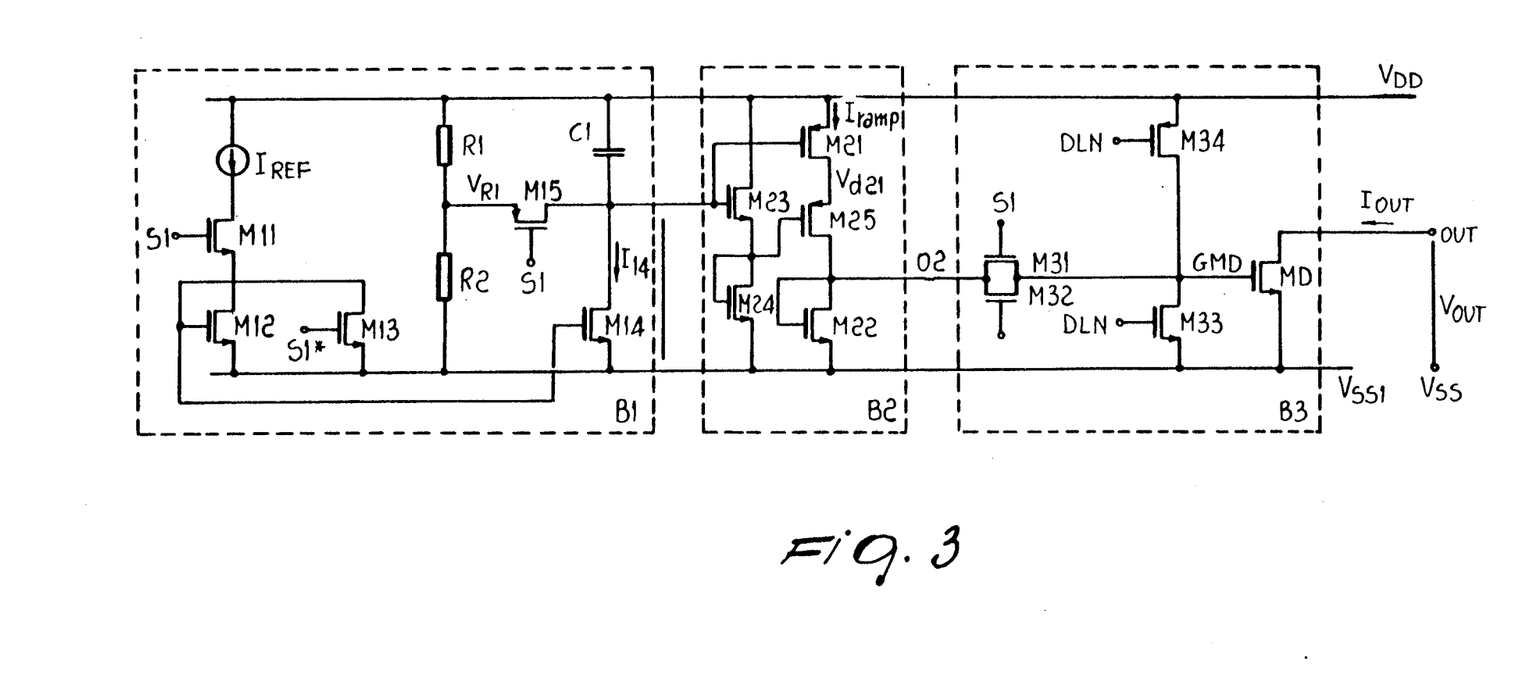
FIG. 3 is a more detailed circuit diagram of an implementation of the block diagram of FIG. 2.

FIG. 3 is a more detailed illustration of the circuit of FIG. 2.

Generation of the voltage ramp

In the block B1, two N-channel transistors M12 and M13 are connected in parallel to each other. These transistors are connected in series to an N-channel transistor Mi1 into which a constant current is injected by a reference current source $I_{REF}$. The transistor M12 is diode-connected in order to conduct permanently, whereas M11 and M13 are controlled respectively by the direct signal S1 and by the corresponding negated signal S1*. The voltage on the node between the transistors M11 and M12 is applied to the gate electrode of an N-channel transistor M14. The drain electrode on transistor M14 constitutes the output node 01 of the block B1. The drain of transistor M14 is also connected to the power supply through a capacitor $C_1$ in which the parasitic capacitors of the node 01 are included.

The node 01 is also connected to a resistive divider R1 and R2. This resistive divider is connected between the power supplies in order to generate a constant reference voltage $V_{RI}$ through a P-channel transistor M15. The gate electrode of transistor M15 is driven by the signal S1.

When S1="0", M11 is "off", M13 is "on", and therefore M14 is turned "off". The transistor M15 is "on" and keeps the output node 01 at the voltage value $V_{RI}$.

When S1 shifts to the "1" level, M11 is switched "on" and M13 and M15 are switched "off". The current $I_{REF}$ is thus mirrored with an adequate mirroring factor in the transistor M14. Additionally, when M14 is switched "on", the capacitor $C_1$ is charged with a constant current $I_{14}$. The voltage $V_{01}$ at the node 01 will thus have a plot which decreases in time in a linear manner, according to the relation $$\frac{dV_{01}}{dt} = -\frac{I_{14}}{C_1}.$$

When the signal S1 returns to "0", the node 01 is returned to its initial conditions, i.e. to the voltage $V_{RI}$. The voltage $V_{RI}$ is chosen with a criterion which will be explained hereinafter.

Naturally, the generation of the voltage $V_{RI}$ by means of a resistive divider is indicated only by way of example and might be implemented in another manner. For example, $V_{RI}$ may be generated by a chain of two or more MOS transistors, or might be supplied from outside the circuit.

Generation of the Current Ramp

The voltage ramp on the node 01 is converted into a current ramp by operating a MOS transistor in the triode area. The relation between the drain current $I_d$ and the gate-source voltage $V_{gs}$ of a transistor which operates in this area is given, as a first approximation, by the equation:

$$I_d = \mu C_{ox}(W_e/L_e)V_{ds}[(V_{gs}-V_{th})-\tfrac{1}{2}V_{ds}] \quad (2)$$

In equation (2), $\mu$ is the effective mobility of the carriers in the channel, $C_{ox}$ is the capacitance of the gate oxide per unit area, $V_{th}$, $W_e$ and $L_e$ are respectively the threshold voltage, the effective width and the effective length of the transistor, and $V_{ds}$ is the voltage applied between the drain and the source of the transistor.

From relation (2) it can be seen that, if the voltage $V_{ds}$ is kept constant, a linear variation in time of the voltage $V_{gs}$ is matched by an also linear variation of the drain current $I_d$. This relationship is used in the conversion performed by the block B2.

The block B2 comprises a pair of P-channel transistors M21 and M25 connected in series. The source of M21 is connected to the power supply line $V_{DDI}$. The drain of M25 is connected to the power supply line $V_{SSI}$ through a diode-connected N-channel transistor M22. The block also comprises a transistor M23 and a transistor M24, both of which are N-channel type transistors. Transistor M24 is diode-connected and forms a source follower which controls the gate of M25. The node 01 of the block B1 is connected to the gate electrodes of the transistors M21 and M23. The drain of the transistor M22 constitutes the output node 02 of the block B2. The voltage $V_{RI}$ in the block B1 is chosen so that it keeps the transistor M21 of the block B2 at the conduction limit when the signal S1 is "0".

In order to explain the operation of the above described circuit, it is noted that the transistors M22, M23, M24 and M25 operate in the saturation area and the following relation is therefore valid for them:

$$I_d = \tfrac{1}{2}\mu C_{ox}(W_e/L_e)(V_{gs}-V_{th})^2 \quad (3)$$

The symbols in equation (3) have the same meaning as the symbols in relation (2).

The current which flows through M25 is equal, as a first approximation, to the current which flows through M21, but increases as the voltage $V_{01}$ decreases. This increase in current flow leads to an increase in the modulus of the gate-source voltage of M25, as expressed by relation (3). However, the voltage applied to the gate of M25 decreases in time during the voltage ramp. Therefore the net effect is to keep the voltage $V_{DD}-V_{21}$ across M21 approximately constant.

If $V_{d21}$ is chosen appropriately, so as to make transistor M21 operate in the triode area and thus in compliance with relation (2) (for example $V_{DD}-V_{d21}\approx 500$ mV), this operation of transistor M21 produces a current which increases proportionally to $V_{gs}$, (i.e., a current $I_{ramp}$ whose plot is a linear ramp), and flows in the transistor M21 during the voltage ramp which arrives from the block B1. This current is substantially identical to the current flowing in M22 (by virtue of the adequate speed of the block B2) and is mirrored in the stage B3.

The transistor M21 operates in the saturation area for a short time at the beginning of the switching step because the voltage applied between its gate and source electrodes is initially very close to the threshold voltage. However, in practice this causes no problems because it simply produces a non-linearity in the plot of the current which passes through M21 for low values of current and for a very short period of time.

Figure 4:
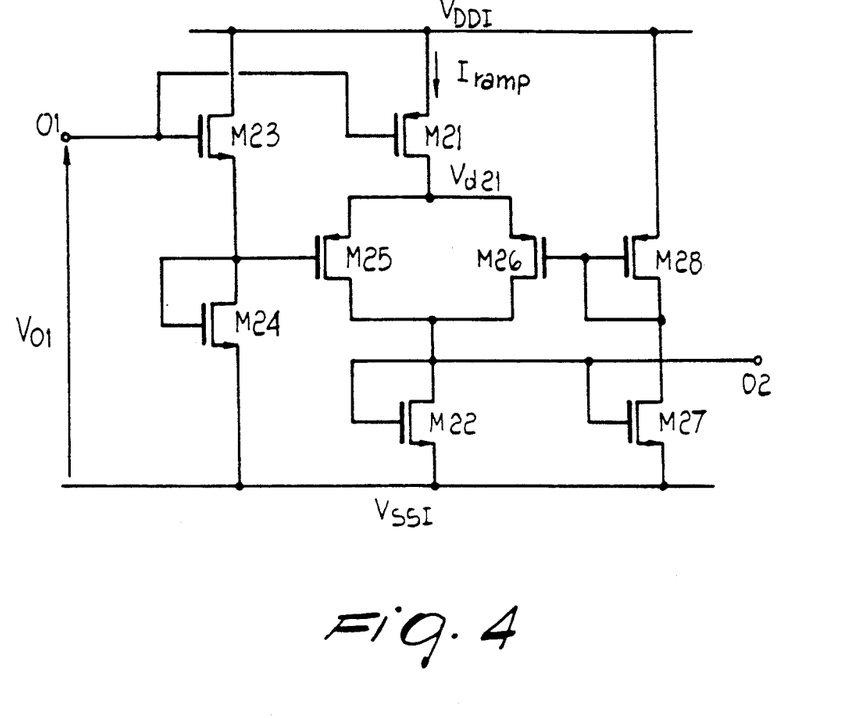
FIG. 4 is a circuit diagram of a first variated embodiment of the block B2 of FIG. 3.

FIG. 4 illustrates another embodiment of the block B2 which includes the same components as the one described above, but has additional transistors M26, M28 (both of the P-channel type) and M27 (of the N-channel type). The current which flows through M22 is substantially $I_{ramp}$. This current is mirrored in the branch constituted by the transistors M27 and M28 which operate in the saturation area. The voltage applied to the gate electrode of M26 decreases as the current $I_{ramp}$ increases.

The transistor M26, which is initially off, starts to conduct when $I_{ramp}$ exceeds a preset value, and then operates in the saturation area. It therefore drains part of the current $I_{ramp}$, reduces the requirements imposed on the set formed by M23, M24 and M25, and contributes to the control of the voltage $V_{d21}$. An increase in the drain current simultaneously with a reduction of the gate-voltage also occurs for the transistor M26 and M25.

Another simpler embodiment of the block B2 is illustrated in FIG. 5, which again comprises the transistors M21 and M22. This embodiment functions identically to those already described, but transistor M25, with the associated control circuit, is replaced with the transistor M29, whose gate is controlled by a source of a fixed voltage VREF which has an appropriate value. The transistor M29 must have a very high aspect ratio $W_e/L_e$. This very high aspect ratio allows the voltage $V_{gs} - V_{th}$ to remain low when the current $I_{ramp}$ reaches its maximum value (for example, lower than 100 mV). In this manner, the variation of the voltage $V_{d21}$ during the output switching phase is contained and the current which flows in M21 has a plot which increases in a substantially linear manner in time.

Figure 5:
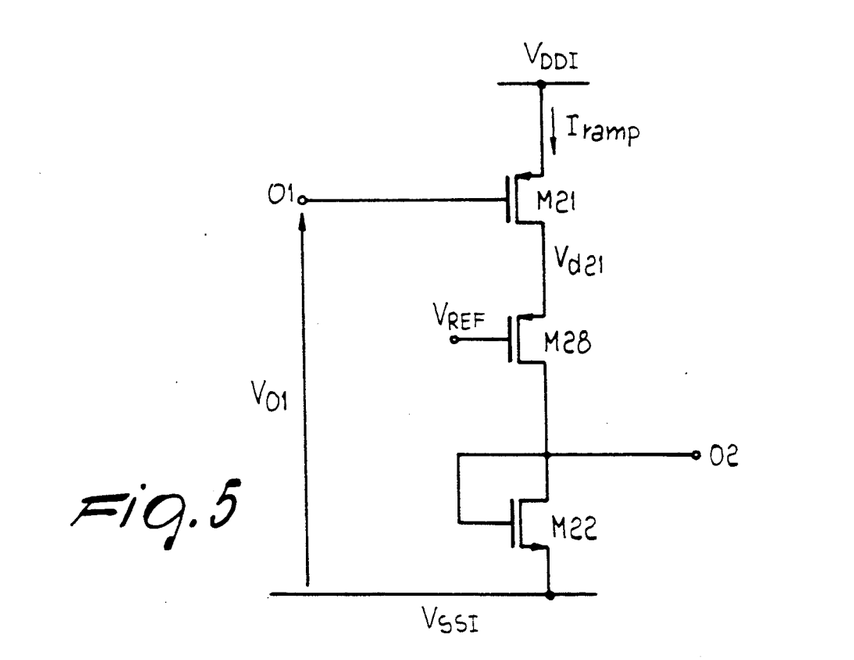
FIG. 5 is a circuit diagram of a second variated embodiment of the block B2 of FIG. 3.

When the buffer is integrated in a circuit manufactured with mixed bipolar-CMOS technology, the MOS transistor M29 can be advantageously replaced with a bipolar transistor. The voltage between the base and the emitter of a bipolar transistor has very small variations even in the presence of a large change in collector current, so the variation of the voltage $V_{d21}$ is small as the current $I_{ramp}$ varies.

Output stage

With reference again to FIG. 3, a preferred embodiment of the output stage B3 is now described. Said output stage comprises a pull-down output N-channel transistor MD' whose gate GMD is connected to the output node 02 of the block B2 through switch means constituted by a pair of complementary transistors M31 (of the N-channel type) and M32 (of the P-channel type). Transistors M31 and M32 are connected in parallel and are controlled respectively by the direct and negated versions of the timing signal S1. The drain of the transistor MD' is connected to the output node OUT of the circuit for connection to the capacitive load (not illustrated in FIG. 3). When the timing signal S1 is high, the two transistors M31 and M32 are "on", and the transistors M22 of the block B2 and MD' of the block B3 form a current mirror.

In order to maintain control of the transistor MD', the gate of transistor MD is preferably connected respectively to the two power supplies $V_{SSI}$ and $V_{DDI}$ by means of transistors M33 (of the N-channel type) and M34 (of the P-channel type). Transistors M33 and M34 are controlled by the signal DLN as described above, which is low if and only if it is necessary to provide a low level in the output. In static conditions, MD is kept "on" by the transistor M34 when a low output level is desired. MD is kept "off" by the transistor M33 in the opposite case. The size of M34 is such as to not affect significantly the time plot of the voltage on the node GMD during the output switching step, when said output must pass from "1" to "0". In practice it is sufficient for the aspect ratio $W_e/L_e$ of M24 to be very low, so that it is capable of delivering a current which is much smaller than $I_{ramp}$.

Figure 6:
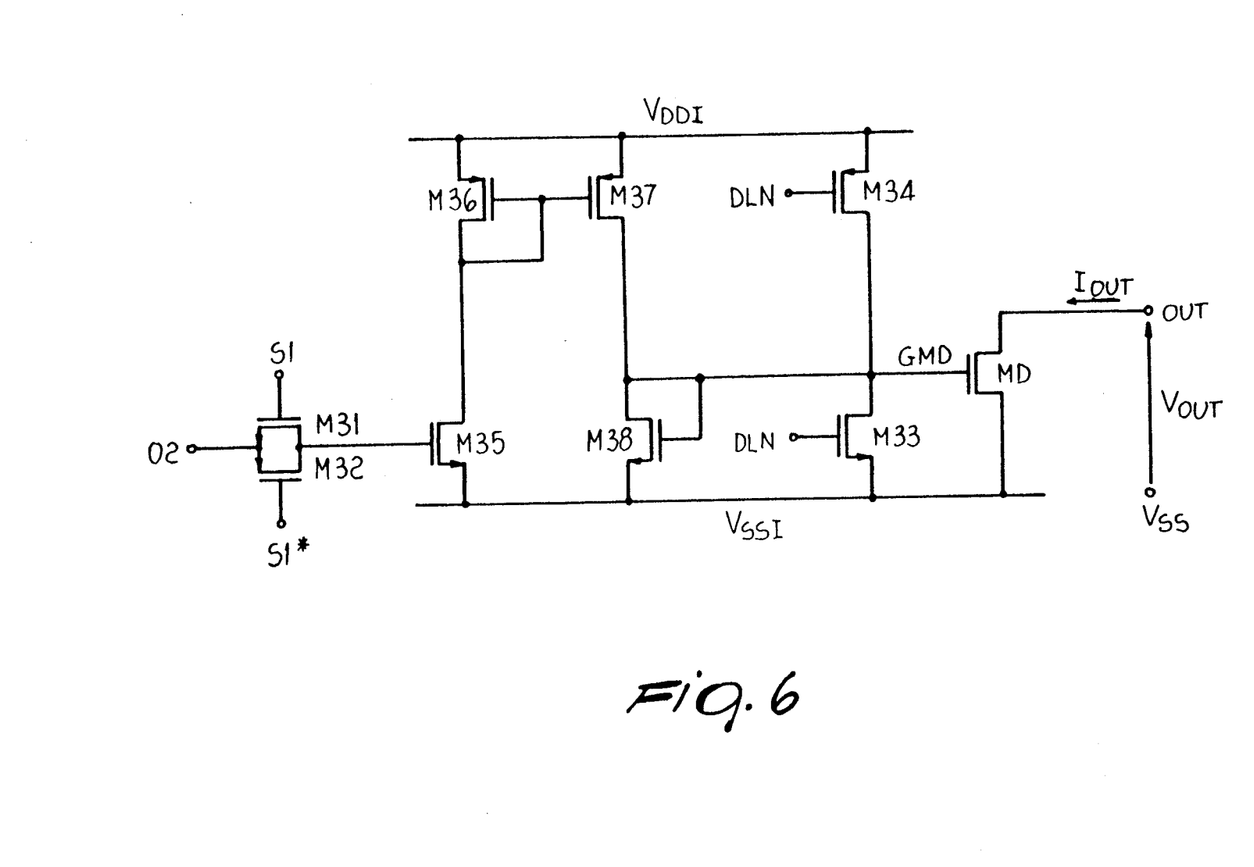
FIG. 6 is a circuit diagram of a variated embodiment of the block B3 of FIG. 3.

The transistor M22 of the block B2 is coupled to the output transistor MD in a substantially direct manner (except for the interposed switching means) in FIG. 3. This coupling can be provided in a more sophisticated manner. FIG. 6 illustrates a variated embodiment of the output stage B3 which differs from the one described above with reference to FIG. 3 by virtue of the presence of two current mirroring stages between the node 02 and the output transistor MD.

In this case the node 02 drives (always through the switching means M31 and M32) an N-channel transistor M35 which controls a current mirror formed by P-channel transistors M36 and M37. This current mirror in turn controls a current mirror composed of an N-channel transistor M38 and already described transistor MD. The transistors M33 and M34 are still present and function as described above. This implementation allows for the optimization of the coupling between the transistor M22 and the pull-down output transistor MD. This optimization in turn minimizes the degradation of the speed of the circuit which might occur in the circuit of FIG. 3 due to the high capacitive load of the transistor MD.

COMPLETE BUFFER

A complete buffer can be executed, as mentioned above, by duplicating the pull-down circuit of FIG. 3 with another exactly complementary circuit which can perform the pull-up function. A more advantageous and complete buffer solution, however, is now described with reference to FIG. 7.

Figure 7:
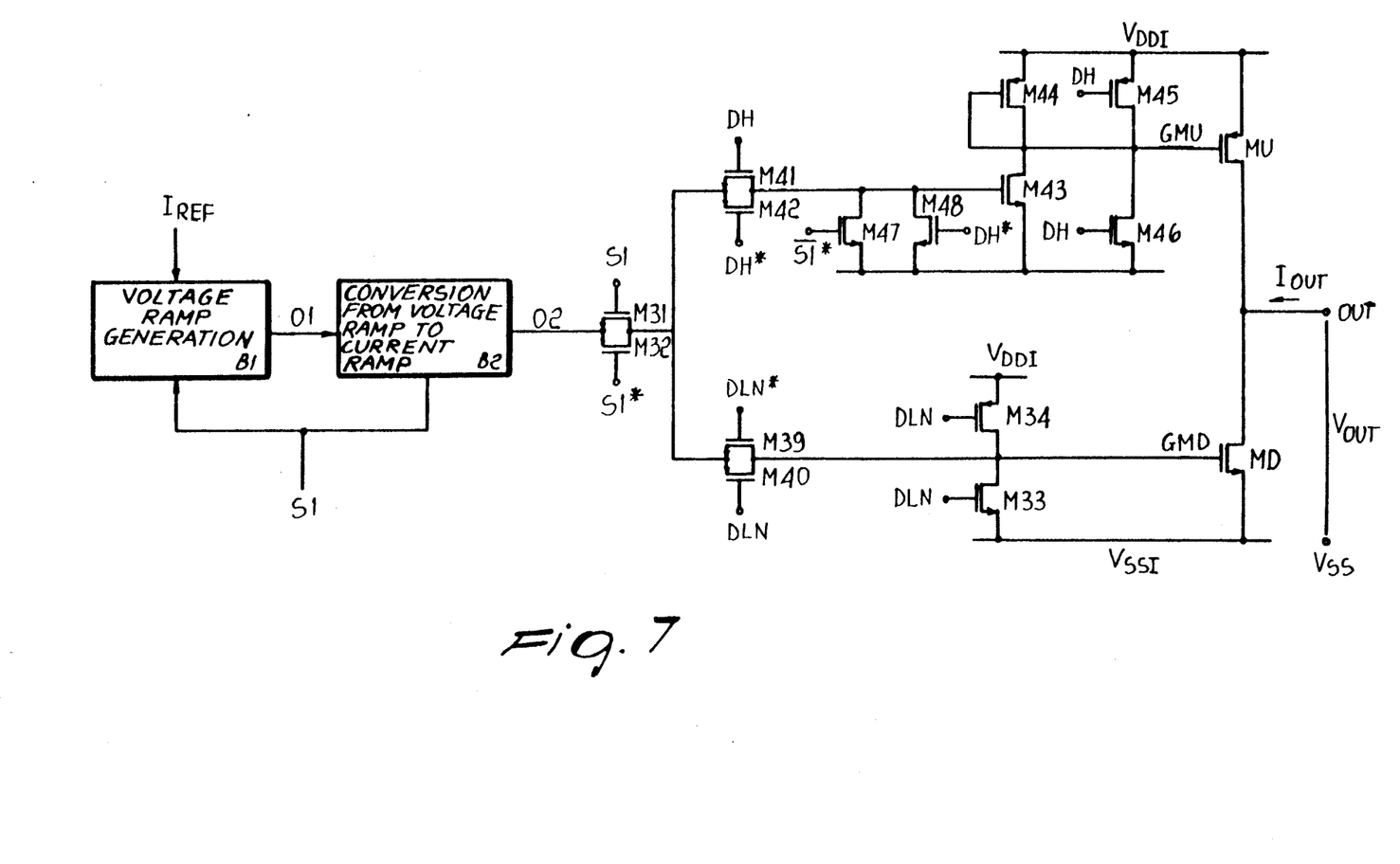
FIG. 7 is a circuit diagram, partially in block form, of a complete buffer according to the invention.

This solution requires, in addition to the timing signal S1 (which becomes high in order to cause switching) and signal DLN (which becomes loll in order to provide a low level in output), a new signal DH which is kept at "1" to provide a high level in the output and at "0" in the other cases.

The circuit of FIG. 7 comprises two blocks B1 and B2 according to FIG. 3 or to another variation. The output node 02 of the block B2 is connected to the pull-down transistor MD on one side with a circuital arrangement similar to the one already described for FIG. 3. This embodiment requires for the interposition of further switching means constituted by two transistors M39 and M40, respectively of the N-channel and P-channel type. Transistors M39 and M40 are controlled by the signal DLN in the negated and direct forms. On the other side of the buffer circuit, the connection reaches an N-channel transistor M43 through switching means constituted by a pair of transistors M41 (of the N-channel type) and M42 (of the P-channel type). Transistors M41 and M42 are controlled by the signal DH in its direct form and in its negated form (DH*).

The transistor M43 controls a P-channel current mirror which comprises a transistor M44 and a pull-up transistor MU. The drain electrode of MU is connected to the output OUT which is connected in common with the drain of the pull-down transistor MD. The gate electrode GMU of the transistor MU is controlled by two transistors M45 (of the N-channel type) and M46 (of the P-channel type). Transistors M45 and M45 are controlled by the signal DH.

This part of the circuit also comprises two N-channel transistors M47 and M48 which are connected between the gate of M43 and the power supply $V_{SSI}$. Transistors M47 and M48 are controlled by S1* and DH*, respectively, in order to eliminate the absorption of current on the part of the branch formed by M43 and M44 when the switching from "0" to "1" in the output is not performed. M47 and M48 eliminate current absorption because S1 must be equal to "0" and/or DH must be equal to "0" in cases where the switching from "0 to "1" in the output is not performed.

The operation of the circuital arrangement of FIG. 7 is evident to the person skilled in the art because of its similarity to the circuits of the preceding figures. When the signals DLN and DH are both "0", the current ramp generated by the block B2 is mirrored on the pull-down transistor MD. When the signals DLN and DH are both at "1", the current ramp is mirrored on the pull-up transistor MU. It should be noted that if one imposes DH ="0", DLN="1", the current ramp is not transferred to the output at all, because both output transistors MD and MU are "off". This situation places the buffer in a high output impedance state. It can therefore be used as "tristate"buffer.

When it is necessary to drive several output pins having the same switching-speed and capacitive-load requirements in a device, blocks B1 for voltage ramp generation and B2 for current ramp generation, can be shared by a plurality of buffers. Such sharing is possible because the operation of these blocks does not depend on the logic level which must be transferred to the output.

In this case it is obviously necessary to insert a circuit which optimizes the coupling between the block B2 and the individual output stages (blocks B3) associated with the various pins. Direct driving of a plurality of output stages would lead to an excessively high load for the block B2. Optimization of coupling is therefore necessary in order to avoid degrading the resulting electric characteristics of the circuit. This optimization circuit is typically composed of some type of current mirroring stages, such as those already illustrated with reference to FIG. 6.

Figure 8:
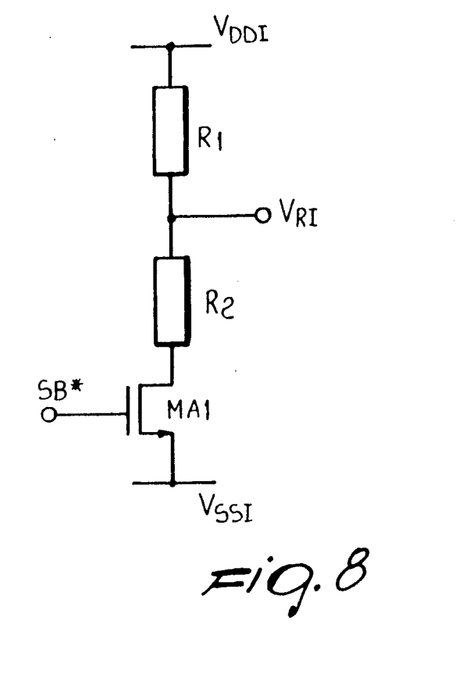
FIGS. 8, 9 and 10 are circuit diagrams of modifications of the circuits in the preceding FIGURES in order to reduce current consumption.

If it is necessary to reduce current absorption substantially to zero when the integrated circuit in which the buffer is inserted is in standby conditions, the described circuits can be easily modified in order to provide this feature. Reduction in current absorption to substantially zero can be accomplished with the addition of a few auxiliary transistors controlled by an additional standby signal SB. SB is high when the circuit must be put in standby conditions and is low otherwise. FIG. 8 illustrates the insertion of an N-channel transistor MA1 in series to the divider R1 and R2 of FIG. 3. Transistor MA1 is controlled by the negated signal SB* of said standby signal.

Figure 9:
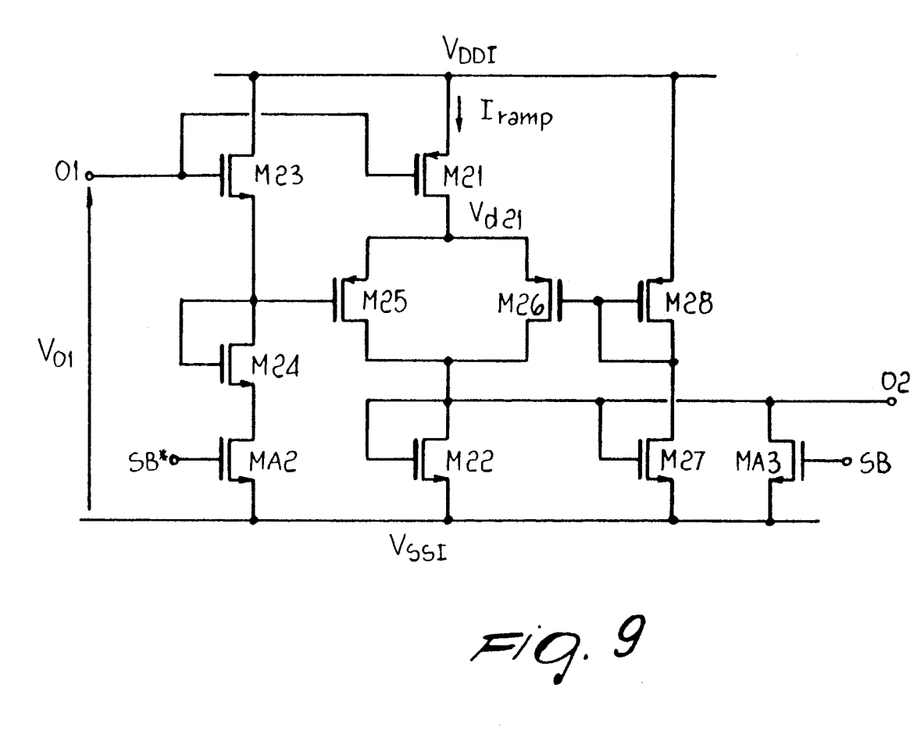

FIG. 9 illustrates a similar circuit to FIG. 4, but modified with the addition of N-channel transistors MA2 and MA3. Transistors MA2 and MA3 are respectively controlled by SB* and SB.

Figure 10:
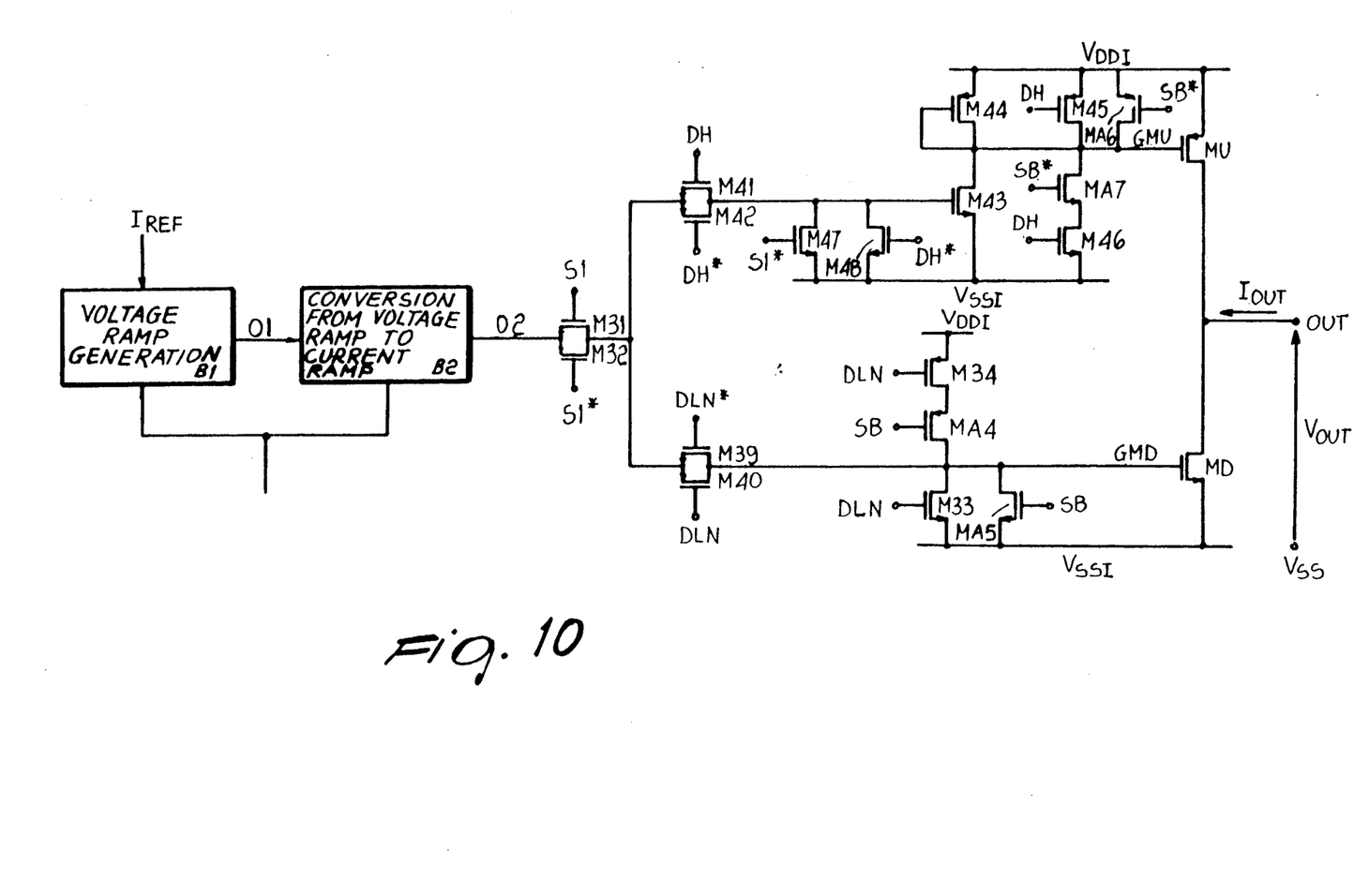

Finally, FIG. 10 is substantially the diagram of FIG. 7, but with the addition of transistors MA4, MA6 (of the P-channel type) and MA5, MA7 (of the N-channel type). MA4 and MA5 are always driven by the signal SB in direct form, and MA6 and MA7 are driven by the signal SB*. One skilled in the art will immediately understand that the activation of signal SB switches the transistors MA1–MA7 so as to interrupt all the current paths which would give rise to absorptions during standby conditions (naturally, S1="0" during standby).

Some preferred embodiments of the invention have been described, but the person skilled in the art can devise other equivalent variations and modifications, within the scope of the present invention. For example, a voltage ramp might be designed with a circuit which is complementary to the one illustrated in FIG. 3, thereby obtaining a rising ramp rather than a falling one. This type of voltage ramp could be applied between the gate and source electrodes (with the source electrode connected to $V_{SSI}$) of an N-channel transistor which is forced to operate in the triode area with a constant voltage between drain and source.

We claim:

1. A fast capacitive-load driving circuit for integrated circuits which driving circuit includes at least one pull-down transistor suitable for driving said capacitive load, the driving circuit including:
   a ramp voltage generator which is controlled by a timing signal to generate age signal which varies in time in a substantially linear manner during a predetermined interval,
   a voltage/current converter driven by said voltage signal for generating a current-related signal which is proportional to said voltage signal, and
   a current mirror driven by said current-related signal and coupled to said pull-down output transistor for producing a mirrored current in said pull-down output transistor wherein there is a predetermined mirroring ratio.

2. A fast capacitive-load driving circuit according to claim 1 wherein said voltage/current converter comprises:
   a conversion transistor driven by said voltage signal, and
   a voltage adjuster connected to said conversion transistor wherein said adjuster keeps a substantially constant voltage across said conversion transistor during at least a portion of said predetermined interval.

3. A fast capacitive-load driving circuit according to claim 2 wherein said conversion transistor is a MOS transistor driven by said voltage adjuster to maintain said conversion transistor in a triode operating region.

4. A fast capacitive-load driving circuit according to claim 2 wherein said voltage adjuster comprises an adjustment transistor driven by said voltage signal via coupling circuitry.

5. A fast capacitive-load driving circuit according to claim 4 wherein said coupling circuitry comprises a voltage-follower transistor stage.

6. A fast capacitive-load driving circuit according to claim 2 wherein said voltage adjuster comprises an adjustment transistor controlled by a reference voltage.

7. A fast capacitive-load driving circuit according to claim 2 wherein said ramp voltage generator includes a reference voltage connected through an electronic switch controlled by said timing signal to an output node of said ramp voltage generator.

8. A fast capacitive-load driving circuit according to claim 7 wherein said reference voltage is coupled to said conversion transistor to keep said conversion transistor at its conduction limit.

9. A fast capacitive-load driving circuit according to claim 1 wherein said ramp voltage generator comprises a constant current generator controlled by said timing signal for charging a capacitor.

10. A fast capacitive-load driving circuit according to claim 9 wherein said constant current generator comprises a constant current source and a current mirror which is connected between said constant current source and said capacitor.

11. A fast capacitive-load driving circuit according to claim 1 wherein said current mirror includes normally-off switching means enabled by said timing signal only during the generation of the current signal.

12. A fast capacitive-load driving circuit for integrated circuits, the driving circuit including at least on pull-down output transistor and at least one pull-up output transistor each suitable for driving said capacitive load, the driving circuit including:
 a ramp voltage generator which is controlled by a timing signal to generate a voltage signal which varies in time in a substantially linear manner during a predetermined interval,
 a voltage/current converter driven by said voltage signal for generating a current-related signal which is proportional to said voltage signal,
 a first current mirror circuit driven by said current-related signal and coupled to said pull-down output transistor for producing a mirrored current in said pull-down output transistor when a first control signal is present and wherein there is a predetermined mirroring ratio, and
 a second current mirror circuit driven by said current-related signal and coupled to said pull-up output transistor for producing a mirrored current in said pull-up output transistor when a second control signal is present and wherein there is a predetermined mirroring ratio.

13. A fast capacitive-load driving circuit according to claim 12 wherein each of said current mirror circuits includes normally-off switching means enabled by said timing signal only during the generation of the current signal.

14. A fast capacitive-load driving circuit according to claim 12 wherein said ramp voltage generator comprises a constant current generator controlled by said timing signal for charging a capacitor.

15. A fast capacitive-load driving circuit according to claim 14 wherein said constant current generator comprises a constant current source and a current mirror which is connected between said constant current source and said capacitor.

16. A fast capacitive-load driving circuit according to claim 12 wherein said voltage/current converter comprises:
 a conversion transistor driven by said voltage signal, and
 a voltage adjuster connected to said conversion transistor wherein said adjuster keeps a substantially constant voltage across said conversion transistor during at least a portion of said predetermined interval.

17. A fast capacitive-load driving circuit according to claim 16 wherein said conversion transistor is a MOS transistor driven by said voltage adjuster to maintain said conversion transistor in a triode operating region.

18. A fast capacitive-load driving circuit according to claim 16 wherein said voltage adjuster comprises an adjustment transistor driven by said voltage signal via coupling circuitry.

19. A fast capacitive-load driving circuit according to claim 18 wherein said coupling circuitry comprises a voltage-follower transistor stage.

20. A fast capacitive-load driving circuit according to claim 16 wherein said voltage adjuster comprises an adjustment transistor controlled by a reference voltage.

21. A fast capacitive-load driving circuit according to claim 16 wherein said ramp voltage generator includes a reference voltage connected through an electronic switch controlled by said timing signal to an output node of said ramp voltage generator.

22. A fast capacitive-load driving circuit according to claim 21 wherein sa d reference voltage is coupled to said conversion transistor to keep said conversion transistor at its conduction limit.

23. A method for driving a capacitive load wherein a driving circuit includes at least one pull-down transistor suitable for driving said load, comprising the steps of:
 generating a ramp voltage signal which is controlled by a timing signal and varies in time in a substantially linear manner during a predetermined interval,
 generating a current-related signal in response to and proportional to said voltage signal, and
 coupling said current-related signal to drive said pull-down transistor to produce in said pull-down transistor a mirrored current which has a predetermined mirroring ratio to said current signal.

24. A method for driving a capacitive load as recited in claim 23 wherein said driving circuit includes a pull-up transistor suitable for driving said load and said pull-down transistor produces said mirrored current therethrough in response to a first control signal and including the step of coupling said current signal to drive said pull-up transistor to produce in said pull-up transistor a mirrored current which has a predetermined mirroring ratio to said current signal.

* * * * *